United States Patent [19]

Storimans

[11] Patent Number: 4,529,083
[45] Date of Patent: Jul. 16, 1985

[54] ELECTRONIC COMPONENT TRANSPORTER WHEEL

[75] Inventor: Franciscus J. A. Storimans, Stouffville, Canada

[73] Assignee: Frank Storimans Limited, Gormley, Canada

[21] Appl. No.: 514,450

[22] Filed: Jul. 18, 1983

[51] Int. Cl.³ .............................................. B65G 29/00
[52] U.S. Cl. ..................... 198/480; 198/624; 198/653; 198/695; 140/105
[58] Field of Search .......... 140/105, 1, 71 R; 72/191; 198/480, 624, 653, 695

[56] References Cited

U.S. PATENT DOCUMENTS 2,929,289  3/1960  Gorecki ........................... 140/71 R
3,302,767  2/1967  Kuhl et al. ........................ 198/480

Primary Examiner—Francis S. Husar
Assistant Examiner—Linda McLaughlin
Attorney, Agent, or Firm—Fetherstonhaugh & Co.

[57] ABSTRACT

A machine for use in shaping the leads of electronic components has a component transporter which comprises a pair of discs each having a resiliently flexible outer peripheral portion in which a plurality of lead receiving notches are formed. Edge separation slots subdivide the peripheral edge portion into a plurality of independently flexible segments. Magnets are arranged to deflect successive segments laterally away from one another during passage through the loading station to widen the gap between the segments to receive the body of a component therebetween and thereafter permit the successive segments to move toward one another to clamp in the body of a component therebetween. A transfer wheel has a peripheral edge formed with a plurality of component recesses. The transfer wheel is mounted to rotate with its peripheral edge overlapping a length of the outer peripheral portion of the discs during passage through the loading station. A guide rail is arranged one on either side of a slipway which intersects the path of travel of the component recesses of the loading wheel assembly as they pass through the loading station. The slipway is shaped to seat the leads of the component in the notches of the disc. The outer peripheral portion of each segment of the disc is formed with a ramp which provides clearance between the overlapping peripheral edge of the disc and the root circle of the transfer wheel.

7 Claims, 7 Drawing Figures

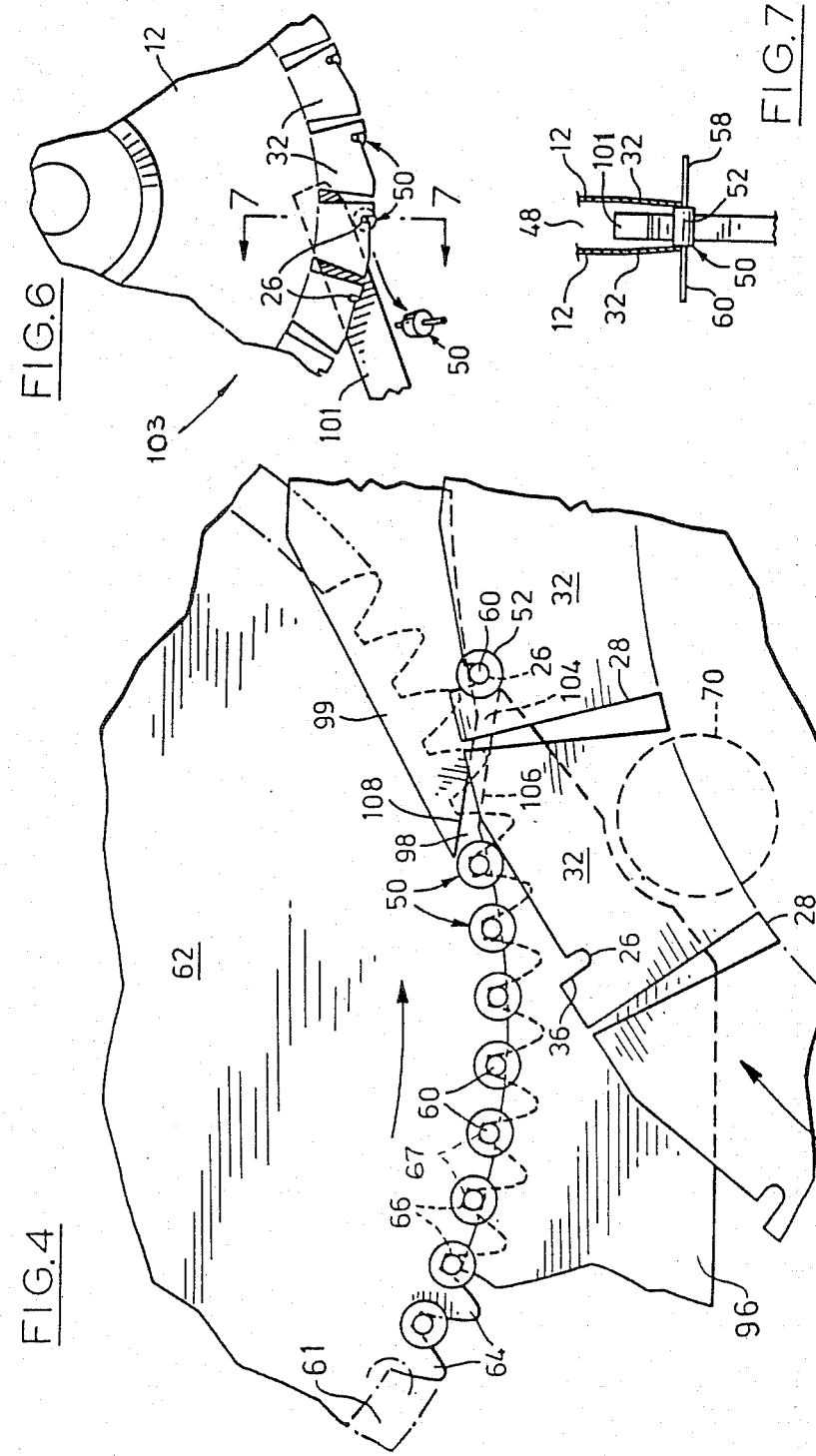

ELECTRONIC COMPONENT TRANSPORTER WHEEL

This invention relates to improvements in a machine for forming the leads of electronic components.

PRIOR ART

In my prior U.S. Pat. No. 4,361,173 dated Nov. 30, 1982, there is disclosed a machine for forming the leads of electronic components and the present invention constitutes an improvement in this machine.

In my prior patent, I have described a transporter in the form of a wheel which is made from resilient plastic material. The wheel is formed with a plurality of pockets at uniformly spaced intervals about the periphery thereof, the pockets being proportioned to receive the body portion of an electronic component. While this mechanism does work well, dimensional variations in the components can create difficulties in attempting to maintain accurate alignment of the leads during the forming of the leads.

Furthermore, because the transporter wheel has pockets into which the body of the component must be inserted, it was necessary to provide a dynamic rocker arm mechanism. Again, while this mechanism does work effectively, it adds to the complexity of the machine.

I have found that by grouping the ends of the body of the electronic components, I can retain the body against rotation while forming the leads thereby increasing the reliability with which the required lead alignment is maintained during the lead forming step.

In addition, I found that this new mechanism facilitates the mounting of the components in the transporter wheel to an extent that it is possible to dispense with the dynamic rocker arm mechanism.

It is therefore an object of the present invention to provide a simple and inexpensive component transporter for use in transporting electronic components in a lead forming machine.

According to one aspect of the present invention, there is provided, in a machine for use in shaping the leads of electronic components of the type having a main body portion and a lead projecting from opposite ends of the main body portion, the machine having a component transporter for transporting components from a loading station to an unloading station, the improvement wherein the component transporter comprises; a pair of discs each having; an outer peripheral edge and a resiliently flexible outer peripheral portion extending inwardly from said outer peripheral edge; and, a plurality of lead receiving notches formed in said outer peripheral portion, said notches extending radially inwardly from said outer peripheral edge at circumferentially spaced intervals, and a plurality of edge separation slots formed in said outer peripheral portion, said separation slots extending inwardly from said peripheral edge of each disc, one on either side of each receiving notch thereby subdividing the outer peripheral portion into a plurality of independently flexible segments, mounting means on said machine for mounting said discs for rotation about a common axis in a spaced relationship to form an open gap therebetween which extends inwardly from the outer peripheral edge thereof, said discs being arranged with the lead receiving notches of one disc aligned with the lead receiving notches of the other disc, deflector means located in advance of said loading station proximate the outer peripheral portion of each disc adapted to deflect successive segments laterally away from one another during passage through said loading station to widen the gap between the segments to receive the body of a component therebetween and thereafter permit the successive segments to move toward one another to clamp in the body of a component therebetween with its leads projecting through said notches.

According to yet another aspect of the present invention there is provided in a machine of the type described in the preceding paragraph, a further improvement comprising a transfer wheel assembly having a peripheral edge formed with a plurality of component recesses, said transfer wheel being mounted to rotate with its peripheral edge overlapping a length of the outer peripheral portion of said discs during passage through said loading station, a pair of guide rails arranged one on either side of a slipway which intersects the path of travel of the component recesses of the loading wheel assembly as they pass through the loading station, said slipway having an entranceway adapted to deflect components away from said path of travel into said slipway, said slipway being inclined toward said discs in the direction of rotation of the discs and having a discharge end located radially inwardly from the peripheral edge of said discs, each notch of said discs having a leading edge and a trailing edge in the direction of rotation of the discs, the trailing edges projecting radially beyond the leading edges and having a sufficient extent to extend across the slipway to form a backstop for driving a component out of the slipway, the slipway being shaped to seat the leads of the component in the notches of the disc, the peripheral edge of each segment of the disc being formed with a ramp which is inclined toward its associated notch in a direction opposite to the direction of rotation of the discs, to provide clearance between the overlapping peripheral edges of the disc and loading wheel in advance of each notch whereby the leads of the component are located radially inwardly of the discs in advance of the backstop.

PREFERRED EMBODIMENT

The invention will be more clearly understood after reference to the following detailed specification read in conjunction with the drawings;

FIG. 4 is a view similar to FIG. 3 showing a second position of the component transporter and loading wheel.

FIG. 6 is a side view of a portion of the transporter extending through the discharge station.

FIG. 7 is a sectional end view taken along the line 7—7 of FIG. 6.

A machine of this general type is described in my prior U.S. Pat. No. 4,361,173 and the following specification is therefore primarily addressed to the features which distinguish the improved mechanism from that previously described.

Figure 1:
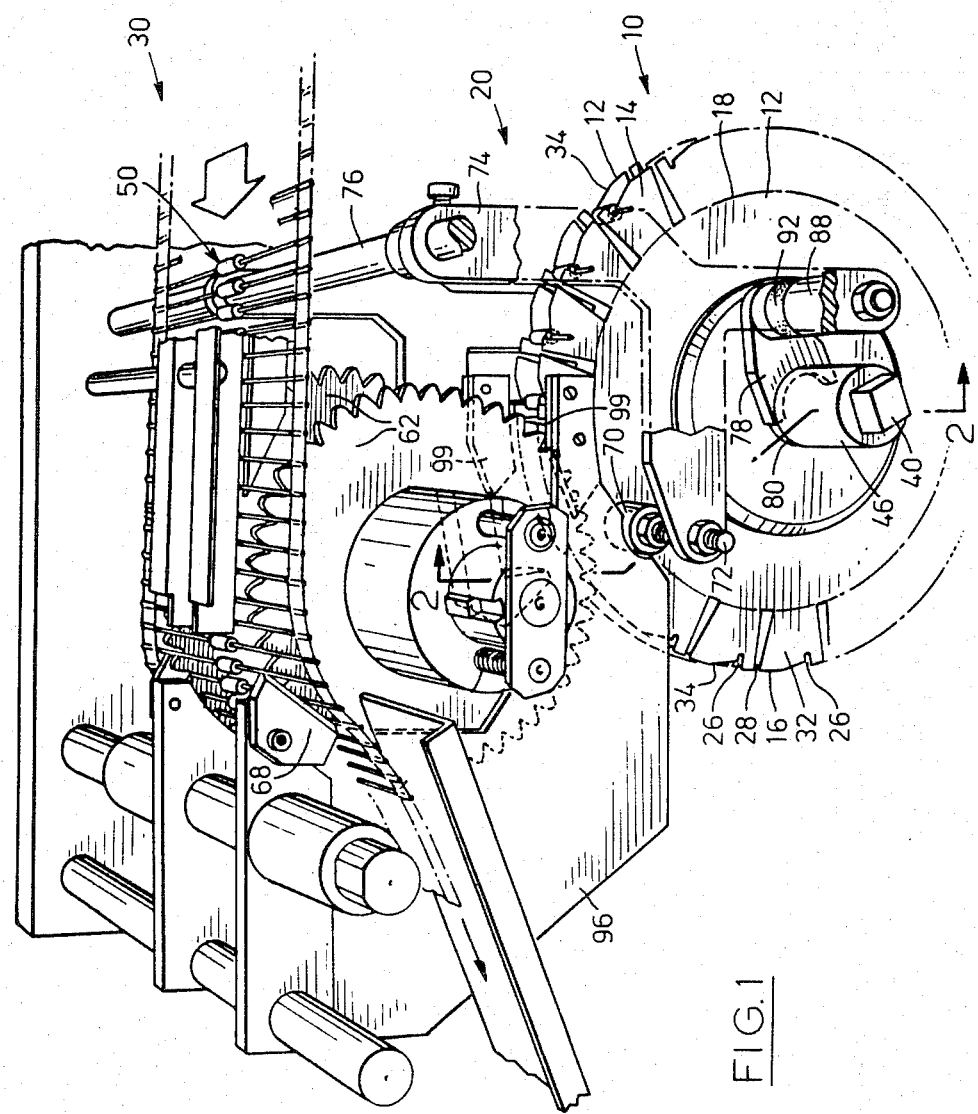
FIG. 1 is a partially sectioned pictorial view of the loading station of a machine for forming the leads of electronic components according to an embodiment of the present invention.

With reference to FIG. 1 of the drawings, the reference numeral 10 refers generally to a component transporter for use in transporting electronic components through a loading station generally identified by the reference numeral 20 of a component forming machine generally identified by the reference numeral 30.

The component transporter wheel 10 comprises a pair of discs 12 each of which is made from thin sheet spring steel. The discs 12 each have a resiliently flexible outer peripheral portion 14 which extends from an outer peripheral edge 16 to the outer peripheral edge 18 of a rigid backing plate 21. The discs 12 are mounted between a backing plate 21 and a collar 22 and are secured by means of mounting screws 24. Lead receiving notches 26 are formed in the outer peripheral portion 14 and extend radially inwardly from the peripheral edge 16. Edge separation slots 28 extend inwardly from the peripheral edge 16 and are arranged one on either side of each notch 26. The slots 28 extend to the peripheral edge 18 of the discs 20 and serve to subdivide the outer peripheral portion 14 into a plurality of independently flexible segments 32. The separation slots 28 increase in width toward the inner end thereof such that the segments 32 are substantially narrower at their radial inner end with the result that the section modulus at the root of each segment is at a minimum with the result that bending will occur about the root when the sections are subjected to lateral displacement.

Figure 3:
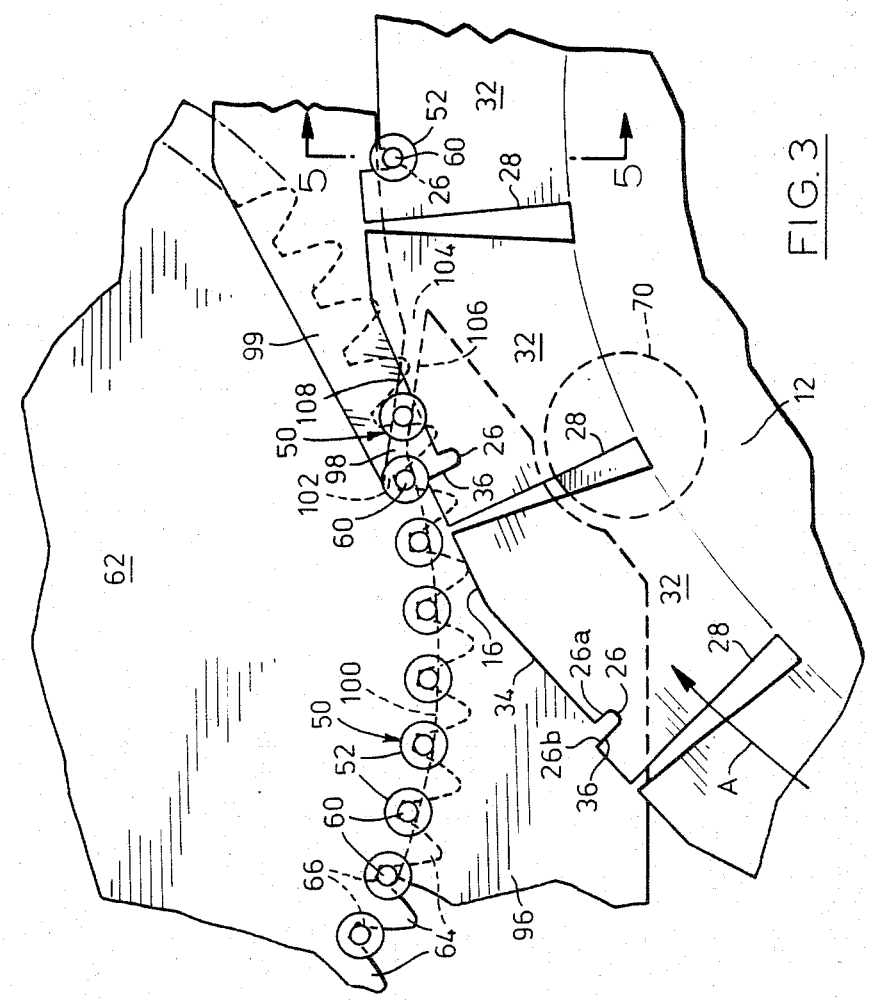
FIG. 3 is an enlarged side view of the outer peripheral portions of the transporter and loading wheel showing the manner in which the components are loaded into the component transporter.

The peripheral edge 16 of each segment 32 is formed with an inclined ramp 34 which is inwardly inclined in a direction opposite to the direction of rotation A of the disc 12 (FIG. 3). Each notch 26 has a leading edge 26a and a trailing edge 26b, the trailing edge 26b projecting radially outwardly from the outer end of the leading edge 26a so as to form a backstop 36 at the end of the ramp 34.

Figure 2:
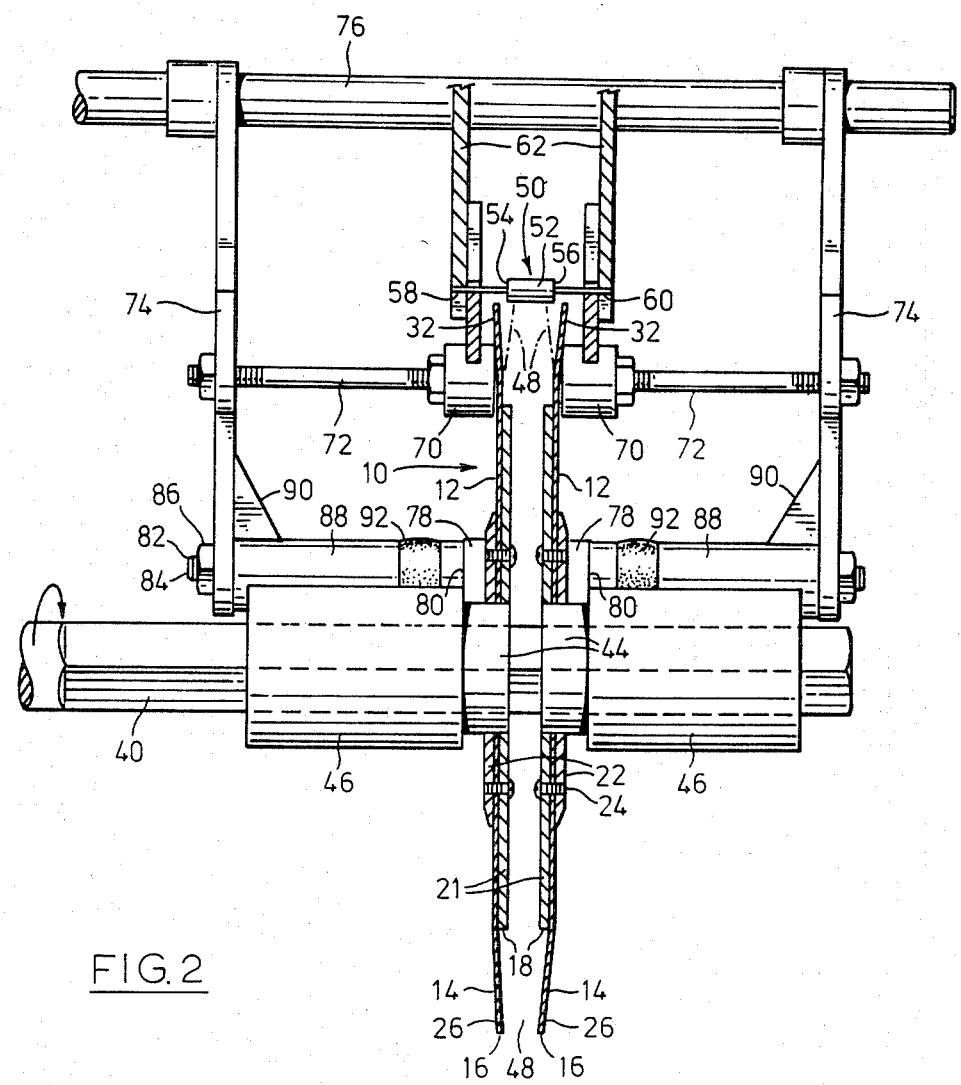
FIG. 2 is a sectional view of the loading station taken along the line 2—2 of FIG. 1.
Figure 5:
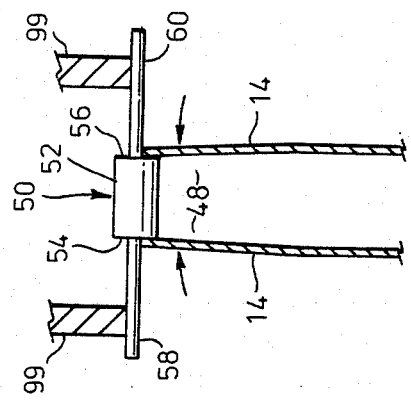
FIG. 5 is a sectional view in the direction of the arrows 5—5 of FIG. 3.

As shown in FIG. 2, the discs 12 and the backing plate 21 and collar 22 to which they are secured, are each formed with a mounting passage 48 by means of which they are mounted on the boss 44 of a spacer 46 which is in turn mounted on the drive shaft 40 so as to be rotably driven thereby in use.

As clearly illustrated at the bottom of FIG. 2 of the drawings, when the discs 12 are in a relaxed configuration, the segments 26 are toed-in toward one another such that the gap 48 which is located between the discs is narrower at the outer peripheral edge 16 than it is at the peripheral edge 18 of the backing plate 21.

The electronic components which are generally identified by the reference numeral 50 each comprise a central body portion 52 which has oppositely disposed end faces 54 and 56 from which leads 58 and 60 project. The leads 58 and 60 are cut to the required length by the mechanism and in the manner previously described in my prior U.S. Pat. No. 4,361,173, and are conveyed to the loading station 20 by transfer wheels 62. The outer ends of the leads 58 and 60 are supported against falling away from the wheels 62 by support ledges formed on the inner faces of the retainer plates 96. These ledges are illustrated in my prior U.S. Pat. No. 4,361,173.

To facilitate transfer of the components 50 from the wheels 62 to the transporter wheel 10, magnets 70 are mounted on shafts 72 which are secured to brackets 74 which are suspended from the shaft 76. The magnets 70 attract the segments 32 which are caused to deflect outwardly from the broken line position shown in FIG. 2 to the solid line position. In this position, the gap 48 is wide enough to receive the main body portion 52. It will be understood that after the sections 32 move away from the magnets 70, the resilient flexibility of the discs 12 will permit the segments 32 to reassert themselves so as to embrace opposite ends 54 and 56 of the main body portion 52 in a clamping relationship.

The discs 12 are maintained in a spaced relationship on the shaft 40 by means of arms 78 which project into grooves 80 which are formed between the spacer 46 and the collar 22. The arms 78 are mounted on the inner end of a shaft 82, the outer end 84 of which is threaded to receive a nut 86. The shaft 82 extends through a sleeve 88 which is secured by a web 90 to the brackets 74. A resilient rubber washer 92 is located between the inner end of the arms 78 and the sleeve 88 and serves to permit limited lateral displacement of the spacers 46 and discs 12 so as to prevent damage to the discs in the event of severe misalignment of the components 50 in use. This resilient mounting also serves to absorb the shock of impact in the lead forming process.

As shown in FIGS. 3 and 4 of the drawings, the transfer wheels 62 each have an outer peripheral portion 61 which is formed with a plurality of teeth 64 and a plurality of lead receiving recesses 66 each of which has a root 67. The leads 58 and 60 of the components 50 are supported by a ledge 100 formed on the inner face of the retainer plates 96. The ledge 100 extends in an arc generated from the axis of the transfer wheels 62. The ledge 100 terminates at a slipway 98 which intersects the path of travel of the components. The slipway 98 is formed between the retainer plate 96 and the stripper plate 99 which act as guide rails and have guide faces 106 and 108 formed thereon which are disposed in opposite sides of the slipway 98 and has an inlet end 102 and an outlet end 104. The guide face 108 projecting across the path of travel of the components and serving to deflect the leads 58 and 60 of successive components into the slipway for movement along the slipway toward the discs 12.

In use, the discs 12 are rotatably driven at a speed which is greater than the speed of rotation of the wheels 62 such that the back stop 36 of each successive notch 26 is driven forward to engage the leads 58 and 60 of a component 50 located in the slipway so as to drive the component along the slipway after it is moved clear of the teeth 64. The incline of the slipway 104 will serve to drive the leads of the component inwardly of the notch 26. It will be noted that the inclined ramp 34 provides clearance which permits the individual segments 32 to overtake the component which is to be located therein while permitting subsequent overlapping of the discs 12 and wheel 62.

The components 50 are ejected from the discs 12 by means of an ejection ramp 106 (FIG. 6) which projects into the gap 48 formed between the discs 12 in the path of travel of the components so as to engage the body portion 52 to drive the component radially outwardly from the discs. The segments 32 being deflected outwardly to release the components.

In use, the discs 12 and wheels 62 are rotatably driven. The belted components are initially engaged by the wheels 62 and driven past cutter blades 68 which serves to remove the salvage and cut the leads to the required length. The components are then conveyed to the loading station wherein the magnets 70 serve to spread the segments 32 apart a sufficient distance and for a sufficient time during rotation to permit the main body portion of a segment to be located therebetween and seated in the notches 26. As the segments 32 move away from the magnets, they return to their toed-in configuration in which they clamp tightly against the end faces 54 and 56 and the main body portion 52 of the component to retain it. The clamping force which is applied by the toed-in segments 32 is sufficient to support the leads during movement of the components through one or more lead forming stations of the type described in my prior U.S. Pat. No. 4,361,173. I have found that by clamping the end faces of the main body of the component in this manner, it is possible to clamp the components sufficiently well to prevent movement of the component relative to the discs likely to cause misalignment of the subsequently formed leads. Further rotation of the discs 12 carries the components to the discharge station 103 wherein the components are ejected by engagement with the engagement ramp 101.

From the foregoing, it will be apparent that the machine of the present invention provides a simple and effective component transporter which is capable of transporting components in a stable manner while employing a minimum number of moving parts to achieve loading and discharge of the components. These and other advantages of the structure of the present invention will be apparent to those skilled in the art.

I claim:

1. In a machine for use in shaping the leads of electronic components of the type having a main body portion and a lead projecting from opposite ends of the main body portion, the machine having a component transporter for transporting components from a loading station to an discharge station, the improvement wherein the component transporter comprises:
   (a) a pair of discs each having; an outer peripheral edge and a resiliently flexible outer peripheral portion extending inwardly from said outer peripheral edge; and,
   a plurality of lead receiving notches formed in said outer peripheral portion, said notches extending radially inwardly from said outer peripheral edge at circumferentially spaced intervals, and
   a plurality of edge separation slots formed in said outer peripheral portion, said separation slots extending inwardly from said peripheral edge of each disc, one on either side of each receiving notch thereby subdividing the outer peripheral portion into a plurality of independently flexible segments,
   (b) mounting means on said machine for mounting said discs for rotation about a common axis in a spaced relationship to form an open gap therebetween which extends inwardly from the outer peripheral edge thereof, said discs being arranged with the lead receiving notches of one disc aligned with the lead receiving notches of the other disc,
   (c) deflector means located in advance of said loading station proximate the outer peripheral portion of each disc adapted to deflect successive segments laterally away from one another during passage through said loading station to widen the gap between the segments to receive the body of a component therebetween and thereafter permit the successive segments to move toward one another to clamp in the body of a component therebetween with its lead projecting through said notches.

2. A machine as claimed in claim 1 wherein said discs are formed from spring steel and said deflector means comprises a pair of magnets located in said loading station and arranged one opposite the outer face of the outer peripheral portion of each disc so as to magnetically attract and thereby deflect the successive segments laterally outwardly from one another.

3. A machine as claimed in claim 1 wherein the discs are formed with their outer peripheral portions toed-in toward one another and spaced from one another a distance which is less than the length of the body of the component which is to be located therebetween so as to retainably grip the body of the component therebetween in use.

4. A machine as claimed in claim 1 further comprising; a transfer wheel assembly having a peripheral edge formed with a plurality of component recesses which extend radially inwardly therof to a common root circle and wherein the peripheral edge of each segment is formed with a ramp which is inclined inwardly toward its associated notch in a direction opposite to the direction of rotation of the disc, said ramp providing a clearance between the peripheral edge of the disc and and said root circle of said transfer wheel which extends through the loading station and meshes with the load transporter wheel to effect transfer of the components from the transfer wheel to the component transporter.

5. A machine as claimed in claim 1 wherein said discs are substantially rigid radially inwardly from the outer peripheral portions thereof, thereby to ensure substantial lateral alignment of successive components mounted therein in use.

6. A machine as claimed in claim 1 further comprising a transfer wheel assembly having a peripheral edge formed with a plurality of component recesses which extend radially inwardly therof to a common root circle, said transfer wheel being mounted to rotate with its peripheral edge overlapping a length of the outer peripheral portion of said discs during passage through said loading station, a pair of guide rails arranged one on either side of a slipway which intersects the path of travel of the component recesses of the loading wheel assembly as they pass through the loading station, said slipway having an entranceway adapted to deflect components away from said path of travel into said slipway, said slipway being inclined toward said discs in the direction of rotation of the discs and having a discharge end located radially inwardly from the peripheral edge of said discs, each notch of said discs having a leading edge and a trailing edge in the direction of rotation of the discs, the trailing edges projecting radially beyond the leading edges and having a sufficient extent to extend across the slipway to form a backstop for driving a component out of the slipway, the slipway being shaped to seat the leads of the component in the notches of the disc, the peripheral edge of each segment of the disc being formed with a ramp which is inclined toward its associated notch in a direction opposite to the direction of rotation of the discs, to provide clearance between the overlapping peripheral edge of the disc and said root circle of the transfer wheel in advance of each notch whereby the leads of the component are located radially inwardly of the discs in advance of the backstop.

7. A machine as claimed in claim 1 further comprising ejector means for ejecting components from the transporter comprising an ejection ramp projecting into said gap and across the path of travel of the components, said ejection ramp being inclined with respect to said path of travel so as to progressively deflect the components radially outwardly from their associated notches.

* * * * *